United States Patent
Maeda et al.

[19]

[11] Patent Number: 6,085,018
[45] Date of Patent: Jul. 4, 2000

[54] INTEGRATED CIRCUIT, ELECTRONIC EQUIPMENT AND METHOD OF ASSEMBLY WHICH USES SAID INTEGRATED CIRCUIT

[75] Inventors: Osamu Maeda; Yoshio Higuchi, both of Daito, Japan

[73] Assignee: Funai Electric Co., Ltd., Osaka, Japan

[21] Appl. No.: 08/937,243

[22] Filed: Sep. 8, 1997

Related U.S. Application Data

[63] Continuation of application No. 08/424,954, Apr. 19, 1995, abandoned.

[30] Foreign Application Priority Data

Apr. 19, 1994 [JP] Japan .................................... 6-104906
Jul. 13, 1994 [JP] Japan .................................... 6-184083

[51] Int. Cl.[7] .................................................. H04N 5/91
[52] U.S. Cl. .............................................. 386/46; 360/69
[58] Field of Search ................................. 386/1, 46, 35, 386/83, 108; 360/69, 81, 83, 84, 85, 88; 257/499; H04N 5/91

[56] References Cited

U.S. PATENT DOCUMENTS

| | | | |
|---|---|---|---|
| 5,103,356 | 4/1992 | Fujiwara et al. ........................... | 360/85 |
| 5,132,806 | 7/1992 | Kitamura et al. ......................... | 358/310 |
| 5,544,356 | 8/1996 | Robinson et al. ....................... | 395/600 |

*Primary Examiner*—Young Lee
*Attorney, Agent, or Firm*—Lackenbach Siegel Marzullo Aronson & Greenspan, P.C.

[57] ABSTRACT

A memory capacity of a memory circuit having a program data which practices a software function is provided with a fixed amount corresponding to each one from an upper rank function to a lower rank function of the software and selects one function (of preparing kind functions) from a series of the integrated circuit group having an interchangeability with respect to lower ranks incorporates those each memory circuit corresponding to the preparing kind functions.

2 Claims, 3 Drawing Sheets

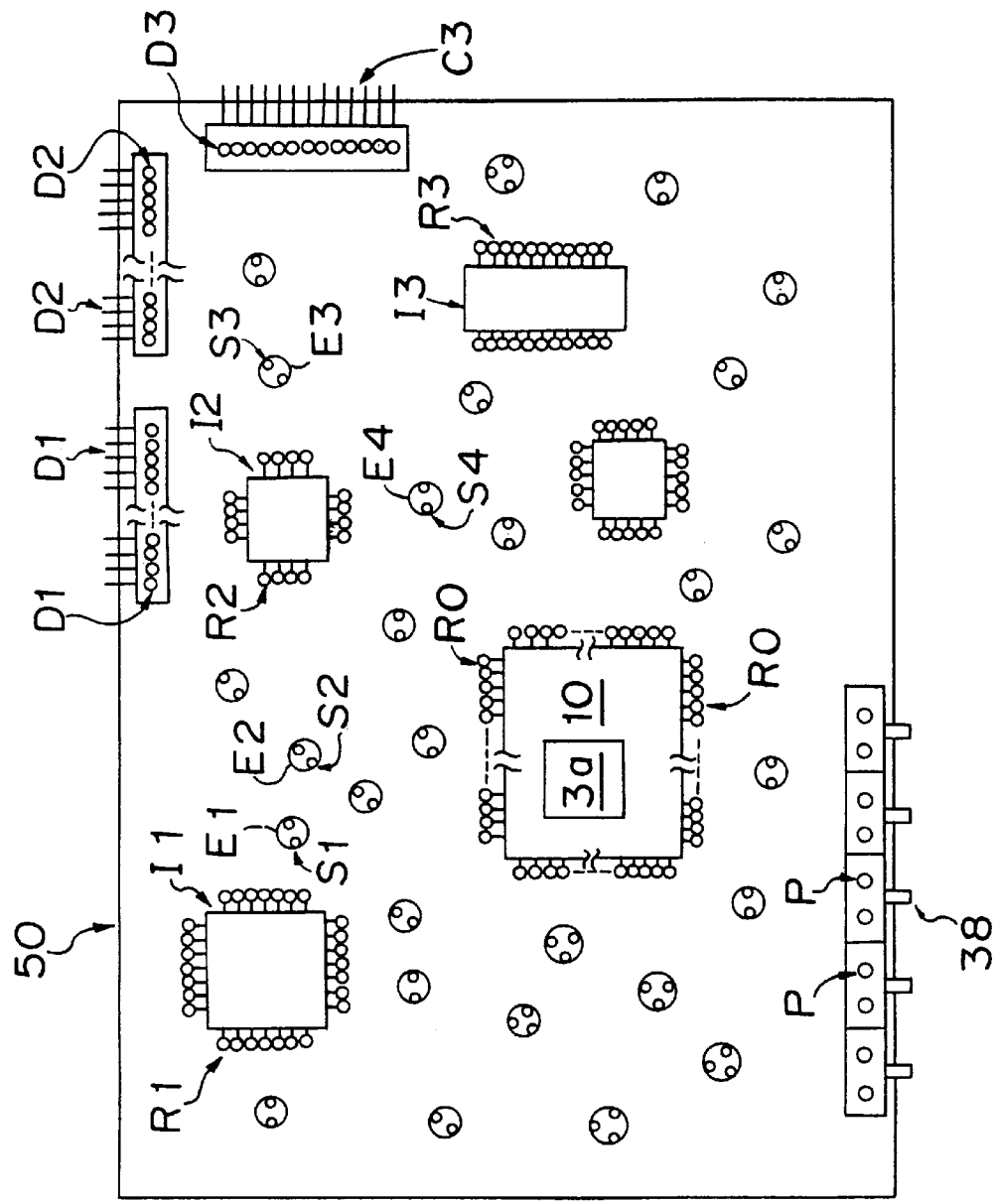

INTEGRATED CIRCUIT, ELECTRONIC EQUIPMENT AND METHOD OF ASSEMBLY WHICH USES SAID INTEGRATED CIRCUIT

This is a continuation, of Application Ser. No. 08/424, 954, filed Apr. 19, 1995 now abandon.

BACKGROUND OF THE INVENTION

This invention relates to an integrated circuit, and electronic equipment and an assembly method which uses suitable integrated circuits when preparing many kinds of electronic equipment having varieties of functions from an upper rank to a lower rank function respectively, according to demand.

The electronic equipment includes a magnetic recording and regenerative unit, video recorder/player, video-cassette recorder and the like. In this case, the additional functions to the magnetic recording and regenerative units include, for example, an on-screen display (OSD), PAL system applicable to a plurality of different languages, HiFi, and two-head system or four-head system having a specification of HiFi or NTSC/PAL regenerative system.

The conventional technologies are explained in an example for the magnetic record and/or the generative apparatus or video tape recorder (hereinafter called "VTR"). The basic structure of this VTR is shown by big block view in FIG. 1.

In FIG. 1, 101 is a TV signal processing portion which processes signals from a tuning circuit 102 of the TV signal, 103 is a video signal processing portion which outputs TV signals being output from said TV signal processing portion to a recording and/or generative circuit 104 where signal recording and generation thereof are performed in conjunction with a magnetic tape and rotary magnetic heads 105 having two-head system or four-head system, and 113 is an antenna terminal.

Number 106 is a timer portion which counts time for a reservation of TV program and for present time, 107 is a key interface portion which inputs a signal from the key input portion 108, 109 is a driver portion which controls an indication to a fluorescent indicating tube 110, and 111 is a driving control portion which outputs the control signal to the driving mechanism 113 which controls magnetic head 105 and capstan 112 for a servo control (speed control, phase control).

A system control portion 120 controls the whole VTR with input and output signals through connections to the tuning circuit 102, timer portion 106, magnetic signal processing portion 103, key interface portion 107, fluorescent indication tube driver portion 109, and the driving control portion 111, respectively.

Formerly, in the VTR described above, the timer portion 106, fluorescent indicator tube driver portion 109, and the system control portion 120 are stored in an integrated circuit 121. On the other hand, the drive control portion 111 is structured to an exclusive integrated circuit called a "digital servo integrated circuit" (this structure is hereinafter called "system 1"). However, in the case of a four-headed system, special regeneration (especially slow regeneration) cannot be smoothly operated in this structure, and a special regenerative integrated circuit or an expensive servo integrated circuit having such function must be additionally used. Thus, in the above structure system 1, when the four-headed system is used, the following two structures are widely used:

a structure wherein the system control portion 120 and the driving control portion 111 are stored in an integrated circuit 122, while the timer portion 106 and the fluorescent indicating tube driver portion 109 are stored in another integrated circuit 123 (this structure is hereinafter called "system 2"); or a structure wherein the system control portion 120, driving control portion 111 and the timer portion 106 are stored in an integral circuit 124, and the fluorescent indicating driver portion 109 is used as an exclusive integrated circuit (this structure is hereinafter called "system 3").

At present, various kinds of VTRs are manufactured and distributed according to user's requests, e.g., even in the VTR of the NTSC system in Japan and the U.S., there exist 2-headed and four-headed systems, and those two systems have further functional additions (e.g., OSD, HiFi, etc.). Such production of various types in small amounts impedes cost reductions. To overcome this, even when many kinds of VTRs having different functional additions are made, common use of parts incorporated into an inner portion and the preparation step are performed. Particularly, when the layout of the circuit boards is made in common, since the common parts are assigned at the same position on the circuit board, an automatic insertion of parts is available by using an automatic inserter, or manual insertion by hand becomes easy, thereby increasing productivity. In other words, in the case of automatic insertion, if the positions of commonly usable parts thereof are memorized, then its insertion can be performed by correction or addition of each memory provided at a certain part according to each kind without any memory of inserting position from first. In addition, in the case of manual insertion, the generation of insertion errors by the operator decreases because the insertion position is the same with respect to the part.

However, when this common usage of parts is enlarged to integral circuits, among the VTR of two- and four-headed systems having various kinds of functional additions, the specification of said integrated circuit is set so that the highest rank function VTR having the largest number of functional additions may operate, then said integrated circuit is allowed to keep the interchangeability to the lower rank function, and accordingly, the VTR in which said integrated circuit is incorporated, includes unused functions.

Accordingly, in order to decrease manufacturing cost, VTRs of a two-head system are made to be common in circuit board and parts by using the structure of system 1, while VTRs of a four-head system are made to be common in circuit board and parts by using the structure of system 2 or 3.

As is illustrated in systems 1, 2 and 3, at least two large-scale integrated circuits were used as its main structures, resulting in increased costs.

Further, as the system control portion and the fluorescence indicating tube driver portion, or the system control portion and the driving control portion were provided in separate large-scale integrated circuits, both integrated circuits were connected with copper foil wires on the circuit board. Accordingly, noises from other devices provided both inside and outside the unit, overlap at the copper foil wires through which the control signal is sent, and cause mistakes in operation. In addition, when the package shape of said integrated circuit (including number of pin) becomes a plurality, the manufacturing step of the integrated circuit and its examination are performed at different organizations, and the results of the examination become different. Accordingly, the simplification of the manufacturing steps of the integrated circuit becomes difficult, and the decrease in cost of the integrated circuit body is also difficult.

On the other hand, if a single integrated circuit is used, the memory circuit (such as ROM, etc.) for software mounted on said integrated circuit requires a great memory capacity for keeping the highest function. Accordingly, the VTR products which use only the lowest function carry unnecessary and expensive memory and no meaning to use a single integrated circuit can be found.

This invention solves such problems and its objects include the following:

1. To make the package shape (number of pins) in the integrated circuit for electronic equipment system control in common use;
2. To select and use one of said integrated circuit groups having a necessary and the minimum suitable ROM capacity corresponding to each of a plurality of functional additions;
3. To decrease the manufacturing cost of the equipment by restricting large-scale integrated circuits to be used to only one; and
4. To decrease the cost of the assembly step by making the main printed circuit board commonly useful and making the inserting positions of the electronic parts to be mounted to the same position; and
   to eliminate the wiring between circuit boards by storing the system control portion and a driven control portion to said one integrated circuit by an effect of one main printed board and to prevent operational errors due to the overlapping of noises.

BRIEF DESCRIPTION OF THE INVENTION

The present invention relates to an integrated circuit for controlling systems of the electronic equipment provided with a memory circuit therein, comprising:

said memory circuit memorizes a program which practices a software function of said electronic equipment, and forms one of a series of integrated circuit groups which has an interchangeability with respect to said lower rank function by incorporating a one memory circuit having each function from a software of a higher rank to a software of a lower rank respectively; each memory capacity of said series of integrated circuit group has a fixed amount which lessens corresponding to each one from said software of upper rank function to lower rank function respectively; the arranged position and size of each outer input-output lead wire of said series of the integrated circuit group are partially or totally the same as those of the lead wire of the integrated circuit of upper rank function; and said signal which inputs or outputs said lead wire has an interchangeability with respect to the integrated circuit to the lower rank function.

The present invention also relates to an electronic equipment provided with an integrated circuit as described above, wherein a main printed circuit board equipped with said integrated circuit and electronic parts related to said integrated circuit which entirely controls said electronic equipment, has lead wire connecting holes so that lead wires of particular electronic parts are consistently inserted at the same coordinated position on the main printed circuit board, assigned positions and its sizes of the connector portion for connecting it to the outer portions from the main printed circuit board are identical for the main printed circuit board, and a main printed circuit board is solely used from said upper rank functions through the lower rank functions.

The main printed circuit board provided with said integrated circuit and the electronic parts related thereto in the present invention, carries a commonly usable wiring pattern for any integrated circuits of from said upper rank function to said lower rank functions, and any particular electronic parts can be inserted at the same coordinated position on the same wiring pattern.

Electronic equipment of the present invention includes a magnetic video recorder and/or its regenerator.

The integrated circuit of said electronic equipment in the present invention may be provided with a total system control portion including recording and/or regeneration processing circuit, timer portion, indication tube control driver portion, with a logic circuit which is directed to a driving control portion of the head and capstan, and with said memory circuit which memorizes a program by which a software function is executed to control two heads or four heads and head and servo driving control of capstan corresponding to the kinds of the function added thereto; and said electronic parts related to said integrated circuit at least include a TV signal tuning circuit, indication tube interface portion, key input interface portion, audio circuit portion, a video circuit and a head and capstan driving interface portion.

The present invention also relates to a method of assembling electronic equipment, in which:

a step of selecting at least one integrated circuit corresponding to a kind of an equipment to be produced and functions to be added from said series of integrated circuit group;

a step of inserting said selected integrated circuit to said main printed circuit board; and a step of mounting said electronic parts only onto said coordinated positions corresponding to said kind of equipment to be produced and function to be added on said main printed circuit board are carried out in this order.

A magnetic video recorder and/or its regenerator which is provided with a memory circuit which memorizes enough amount of program data to executed aimed software functions and essential amount of memories corresponding to said software functions from a higher rank through a lower rank, and an integrated circuit selected for an aimed product from a series of integrated circuit groups having an interchangeability to a lower rank, which comprises:

said selected integrated circuit is provided with a digital circuit integrating the system control portion of said total recorder and/or regeneration unit, timer portion and indication tube control drive portion, and a memory circuit having a software function of the program data by which two heads or four heads and the servo control of the head and capstan portion corresponding to the specification of plurality of added functions regarding the heads;

the assigned position and size of the input and output lead wire of said integrated circuit group and input and output signal thereof have an interchangeability to the lower rank function, respectively; and the main printed circuit board incorporating said integrated circuit carries a commonly usable wiring pattern for any integrated circuit from said upper rank function to the lower rank function.

The integrated circuit for system control of the electronic equipment of this invention incorporates the memory circuit which memorizes the software memory and practical programs. This memory circuit forms an integrated circuit group having a series of the lower rank interchangeability from the upper rank function to the lower rank function as a necessary minimum memory capacity corresponding to each function, and the lead wire of this integrated circuit is the same in position and size and is provided with lower rank interchangeability. Accordingly, when this integrated circuit is used with the electronic equipment, an integrated circuit having the necessary and minimum integrated circuit can be selected.

In the electronic equipment which uses said integrated circuit, the main printed circuit board mounted with the electronic parts including said integrated circuit, has the lead wires connecting holes always at identical positions so that particular electronic parts are inserted at the same assigned positions, all of the electronic parts necessary for the production of electronic equipment which have the highest rank functions are allowed to be inserted on the main printed circuit board and as the electronic equipment carries the lower rank functions, the number of electronic parts is lessened. In other words, the connecting holes of the lead wires of unnecessary electronic parts are not used. Accordingly, only one main printed circuit board is used in common, and since the position of the coordinates of the electronic part to insert is unchangeable from the upper rank function to the lower rank function, the use of an automatic inserter is possible. In addition, in the event of manual insertion, the error insertion examination can be performed in a short time.

Even if said main printed circuit board is used in the same pattern, the same operation is obtained.

The magnetic video recording and/or the regeneration unit is provided with the system control portion of said equipment, timer portion, indication tube control drive portion, a logic circuit for mainly controlling heads and capstan, and a memory circuit which memorizes programs by which software performs the servo driving control of the head and capstan. The unit is also provided with at least one integrated circuit which is necessary and minimum for the equipment of two- or four-head system, to which aimed function is added, and the main printed circuit board is also provided with the electronic parts corresponding to said units, such as TV signal tuning circuit, indication tube, key input portion, interface portion, audio and video circuit portion and driving interface portion of head and capstan.

The recorder and/or the regeneration unit can be assembled by the following method. The integrated circuit group for system control of this invention is prepared to cover a full range of varieties from upper rank function to lower rank function having an interchangeability to the lower rank thereof, in the production of the recorder and/or the regeneration unit, of two or four-head system with one certain functional addition, an integrated circuit having a necessary and minimum memory circuit capacity corresponding to the two- or four-head system with the aimed function added is selected in the first step.

In the second step, said selected integral circuit is mounted on the main printed circuit board which is useful in common to any integral circuit of said record and/or regeneration unit, and in the third step, other electronic parts necessary to the function thereof are also mounted. Since said circuit board is made commonly useful, said electronic parts can be easily mounted on said circuit board just by inserting the parts automatically or manually because the same parts are the same coordinated position.

The memory circuit of said integrated circuit stores the program data of the software function which controls the servo system of the head and the capstan of the unit, and its memory capacity of said memory circuit is decreased to be necessarily minimum.

BRIEF DESCRIPTION OF THE DRAWINGS

FIG. 3 is a main printed circuit board according to an embodiment of this invention.

DETAILED DESCRIPTION OF THE INVENTION

Figure 1:
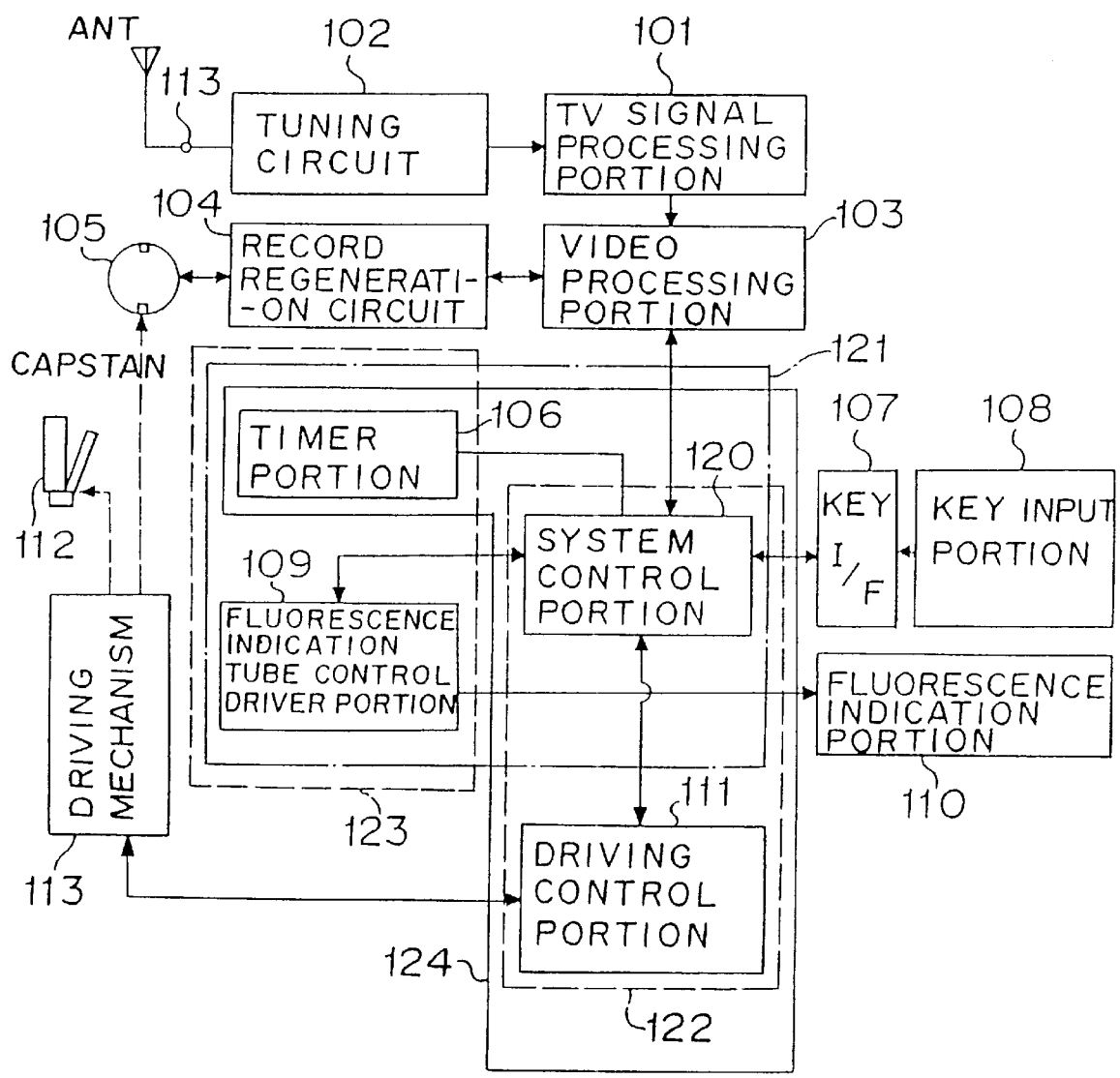
FIG. 1 is an explanatory view which shows a structure of the control circuit in the conventional VTR.

An embodiment of this invention will be described with reference to the drawing as follows.

Figure 2:
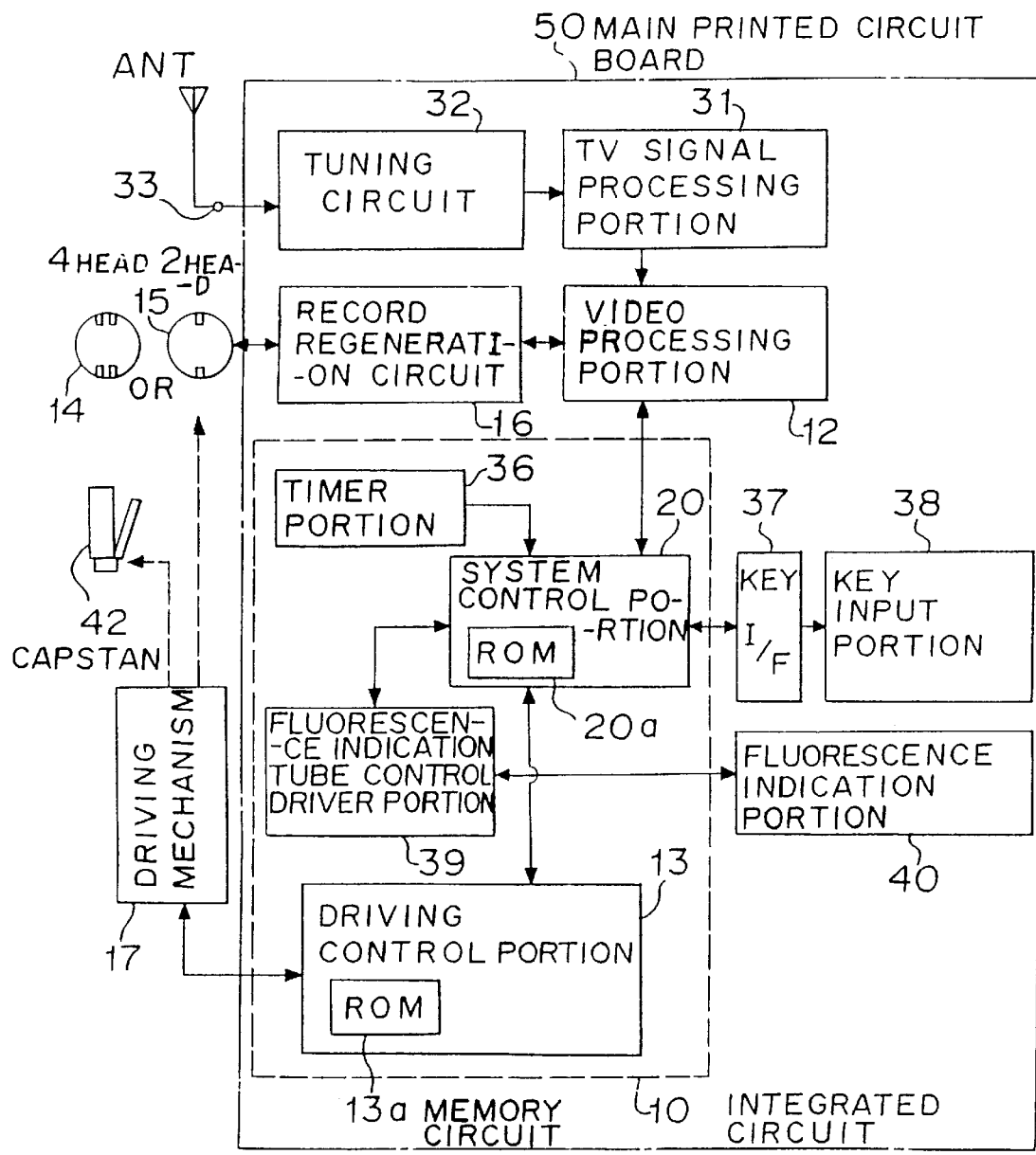
FIG. 2 is an explanatory view which shows a control circuit of a VTR according to an embodiment of this invention.

In FIG. 2, 31 is a TV signal processing portion which processes signals from the tuning circuit 32 of TV signal and 33 is an antenna terminal. The tuning circuit 32 and TV signal processing portion 31 are mounted on the main printed circuit board 50 as an electronic part.

The numeral 12 is a video signal processing portion which processes input and output of magnetic signal between signal record regeneration circuit 16 through magnetic tape and rotary magnetic head 14 (four-head system) or magnetic head 15 (two-head system). In the case of the two-head system and four-head system, corresponding video signal processing portion 12 and record regeneration circuit 16 are also mounted on the main printed circuit board 50 as an electronic part.

The numeral 36 is a timer portion which counts present time and a pre-engaged record of the TV programs, 37 is a key interface portion where the signal from key input portion 38, 39 is a driver portion where an indication to the fluorescent tube 40 is controlled, and 13 is a driving control portion which processes input and output of driver signals of servo systems including driving mechanism 17, magnetic heads 14 or 15 and capstan 42. ROM portion 13a (memory circuit) stores a head servo system control program, including a capstan 42 corresponding to either one kind of two-head or four-head system unit to which various functions are added. In the memory capacity of the program data, a necessary minimum capacity which can be correspondent to this from the lower rank function to the higher rank is made to be either necessary minimum capacity from about 12K byte to about 32K byte. Such electronic parts as key input portions 38, key interface portion 37 and fluorescence indication portion 40 including interface portion are also mounted on the main printed circuit board 50.

The numeral 20 is a system control portion which controls the total VTR unit including the TV signal processing portion 31 and video signal processing portion 12, and a system control program which can be correspondent to any two-head system and any four-head system having various kinds of specifications of each function additions is stored in the ROM 20a.

The numeral 10 of the circuit portion surrounded with a broken line in FIG. 2 shows an integrated circuit which is a video control circuit integrally circled on tip 1. Further, the circuit portion surrounded with a dot-and-dash line is an electronic part mounted on the main printed circuit board 50.

The assembly method of VTR unit which uses the integrated circuit 10 of this invention for system control of series kind wherein only 1 tip ROM portion 13a is different is described as follows.

In VTRs, there exist a plurality of kinds from higher rank function (a plurality of functions are added) to lower rank function (added functions are poor), and software which operate these functions are incorporated in the integrated circuit. A different plurality of kinds of integrated circuits 10 are prepared.

First, from these circuits 10, an integrated circuit 10 which agrees with a head system having a function added specification to be prepared is selected.

For instance, when the VTR is a four-head system with OSD function, and further has a HiFi function, an integrated circuit 10 having the highest function and a great capacity memory circuit of about 32K bytes have to be selected. On the other hand, two-head system with no OSD and no HiFi function necessitate the lowest rank function, and the memory capacity should be an integrated circuit 10 having a small capacity of memory circuit 13$a$ of about 12K bytes.

The integrated circuit 10 thus selected is made to be a package shape in common so as to be attachable to a common main printed circuit board 50. Further, other electronic parts such as video signal processing portion 12, TV signal processing portion 31, key interface 37 and other various kinds of electronic parts shown in FIG. 2 are picked up to add and mounted on a main printed circuit board 50. The mounting of the electronic parts to the main printed circuit board 50 can be prepared more effectively if an automatic inserter or the like is used. However, it is possible even by manual insertion.

In other words, since the main printed circuit board 50 is made to be common so that the same electronic parts may be inserted in the same coordinate positions, the inserted position is not changed even if the function added specifications are different. In the case of a lower rank function, unnecessary electronic parts are not inserted.

This will be described in more detail in FIG. 3. FIG. 3 shows an embodiment of the main printed circuit board 50. There exists an integrated circuit 10 for system control having the memory circuit 3$a$ near the middle portion of the main printed circuit board 50. RO is a connected hole of the lead wire of the integrated circuit 10. The numerals 11, 12 and 13 show the electronic parts E1, E2, E3, E4 . . . , such as condenser, resistance, etc. R1, R2, R3 . . . are holes of the connected holes of the lead wire of the integrated circuits R1, R2, R3 . . . Further, S1, S2, S3, S4 . . . are the connected holes of the lead wire of the condenser, resistance E1, E2, E3, E4 . . . C1, C2, C3 show the connector portions and D1, D2, D3 show each connected hole of each lead wire. The numeral 38 is a key input portion, and P shows a connected hole of each lead wire. The connect holes R0 of lead wire in the main printed circuit board 50 R1, R2, R3 . . . S1, S2, S3 . . . , D1, D2, D3 and P may be in common by arranging these at fixed coordinates without any relation to the addition of the VTR function. In the case of preparation of the lower rank function VTR, the connecting holes for lead wiring of unnecessary electronics parts are not used. The printed circuit between connected holes of the lead wire in FIG. 3 is not shown.

The VTR equipment thus prepared operates as follows:

The servo control program ROM portion 13$a$ of the driving control portion 13 is practiced by the program of ROM 20$a$ of said system control portion 20. For instance, in the case of integrated circuit 10 of the two-head system, a servo program corresponding to the two-head system is practiced, thereby the driving control of the capstan motor and the head-driving motor are performed.

Further, the image signal to be recorded in the magnetic tape by the video signal 2 or the two-head magnetic head 15 read from magnetic head 15 of the two-head is processed by signal.

On the other hand, in the case of the four-head system integrated circuit 10, the servo program corresponding to the four-head system is practiced thereby performing the driving control by driving mechanism 17 of the capstan motor and the head-driving motor.

Further, the video signals read from the magnetic heads 14 of the four-head system and image signals to be recorded on the magnetic tape with head 14 are processed at the video signal processing portion 12.

According to this invention, the following effects are obtained.

(1) Since the logic circuit portion of the integrated circuit for system control of the electronic equipment is made to have a lower rank interchangeability including the pin arrangement so as to correspond from a higher rank to a lower rank of a series of function addition of the electronic equipment, while the memory circuit portion which memorizes the software function is adapted to provide a series of the integrated circuit corresponding to the function addition of the electronic equipment to be prepared to necessary minimum memory capacity according to the function addition, an integrated circuit corresponding to the electronic equipment to be prepared can be selected, thereby decreasing preparation costs.

(2) Since the number of the large-scale integrated circuits used in the electronic equipment is restricted to only one and one sheet of the main printed circuit board is adapted to be in common, and the insertion position of said electronic parts to be mounted are the same so as to be able to use the automatic inserter, assembly costs are decreased and the examination step is shortened.

(3) Even if the layout of both printed circuits are the same pattern, the same effect can be obtained.

(4) Even if the electronic equipment is the recording and/or regeneration unit, the effects shown in (1)–(3) can be obtained.

(5) The logic circuit portion of the integrated circuit is integrated to only one as a system control portion, timer portion, indication tube control driver portion, and head and capstan driving control portion, while the software function program which performs the servo driving portion of the head and capstan is made to be a series of the integrated circuit group provided with a memory circuit having the necessary and minimum memory capacity according to the function addition of the electronic parts related to said integrated circuit is made to be inserted on a sheet of main printed circuit board so as to be able to arrange in the common coordinate, various kinds of even the recording and/or regeneration equipment having varieties of functions can be manufactured in a large scale production method.

(6) The method of assembly of such electronic equipment can shorten the preparation time to increase the yield of the product by selection of the integrated circuit corresponding to the integrated circuit group in the first step, insertion of said electronic parts to the common circuit board of the selected integrated circuit in the second step, and automatic insertion or manual insertion (easy insertion) of only the necessary electronic parts to the function addition in the third step.

(7) Since only one integrated circuit is used, and the memory circuit thereof can be one having a ROM portion of a necessary and minimum ROM capacity corresponding to two-head or 4-head system having function addition from the higher rank to the lower rank, even in the case of preparation of a low rank addition VTR its manufacturing costs are not increased very much.

(8) Since only one integrated circuit is used, errors in operation due to the control signal line or the like between the system control integrated circuit and the indication tube integrated circuit are prevented.

(9) Since the integrated circuit is allowed to hold a lower rank interchangeability to a form (leader) and a signal line and the main printed circuit board are common to the total kinds from a higher rank to a lower rank, a mass production of varieties of products in small amounts can be attained by using an automatic inserter. Manufacturing of the integrated circuit and its testing steps are much simplified, and the number of jigs for the tests can be decreased.

What is claimed is:

1. A video tape player (VTR) comprising:

a printed circuit board (PCB) provided with a set of integrated cicuit (IC) inserting holes formed on said PCB;

one of a first integrated circuit (IC) and a second integrated circuit (IC) selectively mounted on said PCB, said first and second IC-s having a system control memory by which both of a two-head playback function and a four-head playback function are commonly controllable, said first IC having a first control program memory by which said two-head playback function is controllable and a plurality of first input/output pins insertable into said IC insertion holes, said second IC having a second control program memory by which said four-head playback function is controllable and a plurality of second input/output pins insertable into said insertion holes, said first control program memory having a first memory capacity for storing a first control program for controlling said two-head playback function, said second control program memory having a second memory capacity for storing a second control program for said four-head playback function, each of said integrated circuits comprises a system control portion, a timer portion, an indication tube control driver portion, and driving control portion, one of a two-head system rotary magnetic head and a four-head system rotary magnetic head which is selectively adopted in correspondence with selected one of said first IC and said second IC; and a driving means which drives one of said two-head system rotary magnetic head and said four-head system rotary magnetic head in accordance with one of said first control program stored in said first control program memory and the second control program stored in said second control program memory, said driving control portion being programmed to control said driving means, each of said integrated circuits being made to be inserted into said set of IC insertion holes formed on said printed circuit board, whereby either one of said first and second integrated circuits may be mounted on said printed circuit board and a plurality of video tape players having different functions can be manufactured in a large scale production method.

2. A method of selectively assembling a video tape player (VTR), comprising the steps of:

providing a printed circuit board (PCB) with a set of integrated circuit (IC) insertion holes formed on said PCB;

selectively mounting one of a first integrated circuit (IC) and a second integrated circuit (IC) on said PCB, said first and second IC-s having a system control program memory by which both of a two-head playback function and a four-head playback function are commonly controllable, each of said integrated circuits comprising a system control portion, a timer portion, an indication tube control driver portion and driving control portion, said first IC having a first control program memory by which said two-head playback function is controllable and a plurality of first input/output pins insertable into said IC insertion holes, said second IC having a second control program memory by which said four-head playback function is controllable and a plurality of second input/output pins insertable into said IC insertion holes, said first control program memory having a first memory capacity for storing a first control program for controlling said two-head playback function, said second control program memory having a second memory capacity for storing a second control program for controlling said four-head playback function;

selectively adopting one of a two-head system rotary magnetic head and a four-head system rotary magnetic head in correspondence with selected one of said first IC and second IC;

driving one of said two-head system rotary magnetic head and said four-head system rotary magnetic head in accordance with one of said first control program stored in said first control program memory and said second control program stored in said second control program memory; and selectively inserting one of said integrated circuits into said set of IC insertion holes formed on said printed circuit board, whereby either one of said first and second integrated circuits may be mounted on said printed circuit board and a plurality of video tape players having different functions can be manufactured in a large scale production method.

\* \* \* \* \*